(12) United States Patent
Chen et al.

(10) Patent No.: US 8,901,917 B2
(45) Date of Patent: Dec. 2, 2014

(54) ELEMENT MEASUREMENT CIRCUIT AND METHOD THEREOF

(75) Inventors: Ying-Yen Chen, Chia Yi County (TW); Jih-Nung Lee, Hsin Chu County (TW); Chun-Yu Yang, Chia Yi (TW)

(73) Assignee: Realtek Semiconductor Corp., Hsinchu (TW)

( * ) Notice: Subject to any disclaimer, the term of this patent is extended or adjusted under 35 U.S.C. 154(b) by 279 days.

(21) Appl. No.: 13/452,619

(22) Filed: Apr. 20, 2012

(65) Prior Publication Data

US 2012/0274310 A1 Nov. 1, 2012

(30) Foreign Application Priority Data

Apr. 26, 2011 (TW) .............................. 100114379 A

(51) Int. Cl.
*G01R 23/14* (2006.01)
*G01R 31/28* (2006.01)

(52) U.S. Cl.
CPC .................................. *G01R 31/2884* (2013.01)
USPC .................. 324/76.41; 324/76.15; 324/76.24; 324/76.39; 324/76.53; 324/76.64

(58) Field of Classification Search
CPC .... G01R 23/02; G01R 31/2884; H01L 27/06; H03K 3/0315
USPC .......... 324/76.39, 76.15, 76.24, 76.41, 76.42, 324/76.53, 76.64
See application file for complete search history.

(56) References Cited

U.S. PATENT DOCUMENTS

| | | | |
|---|---|---|---|
| 6,912,172 B2 * | 6/2005 | Honma et al. | 365/226 |
| 2004/0049711 A1 | 3/2004 | Korson et al. | |
| 2011/0181337 A1 * | 7/2011 | Otsuga et al. | 327/332 |

* cited by examiner

*Primary Examiner* — Arleen M Vazquez
*Assistant Examiner* — Son Le
(74) *Attorney, Agent, or Firm* — Muncy, Geissler, Olds & Lowe, P.C.

(57) ABSTRACT

An element measurement circuit is provided, comprising a oscillator for generating a first oscillation clock and second oscillation clock, a frequency divider for dividing the first oscillation clock to generate a third oscillation clock and for dividing the second oscillation clock to generate a fourth oscillation clock, a frequency detector for detecting the third oscillation clock to generate a first count value and for detecting the fourth oscillation clock to generate a second count value, and a controller for generating a first oscillation period according to the first count value, for generating a second oscillation period according to the second count value, and for generating a measurement value according to the first oscillation period and the second oscillation period.

15 Claims, 7 Drawing Sheets

ELEMENT MEASUREMENT CIRCUIT AND METHOD THEREOF

BACKGROUND OF THE INVENTION (a) Field of the Invention

The invention relates to a measurement circuit, particularly to an element measurement circuit built in a chip to measure characteristics of the chip.

(b) Description of the Related Art

When CMOS (complementary metal oxide semiconductor) process is developed into nanometer order, the influence of process variation on product becomes greater and thus increasing product yield is more difficult. To figure this problem, a test key is placed in each wafer to collect process information, and a measurement equipment or test machine is required to measure signal parameters. However, measuring signal parameters requires a high-end measurement equipment so that it introduces production cost and adding the equipments may further introduce an error. Furthermore, the test keys is limited in a wafer and is not sufficient to realistically reflect the process variation impacted in each die of the wafer. Therefore, in order to obtain related information to increase diagnostic or debugging capability to reduce production cost, it is necessary to build a circuit in a chip to measure characteristic of elements of the chip.

BRIEF SUMMARY OF THE INVENTION

In light of the above-mentioned problems, one object of the invention is to provide an element measurement circuit built in a chip to measure characteristics of elements of the chip so as to solve the above problems.

According to an embodiment of the invention, an element measurement circuit is provided. The element measurement circuit includes an oscillator, a frequency divider, a frequency detector and a controller. The oscillator generates a first oscillation clock and a second oscillation clock. The frequency divider divides the first oscillation clock to generate a third oscillation clock and divides the second oscillation clock to generate a fourth oscillation clock. The frequency detector detects the frequency of the third oscillation clock according to a reference clock to generate a first count value and detects the frequency of the fourth oscillation clock according to the reference clock to generate a second count value. The controller generates a first oscillation period according to the first count value, generates a second oscillation period according to the second count value, and generates a measurement value according to the first oscillation period and the second oscillation period.

DETAILED DESCRIPTION OF THE INVENTION

Figure 1:
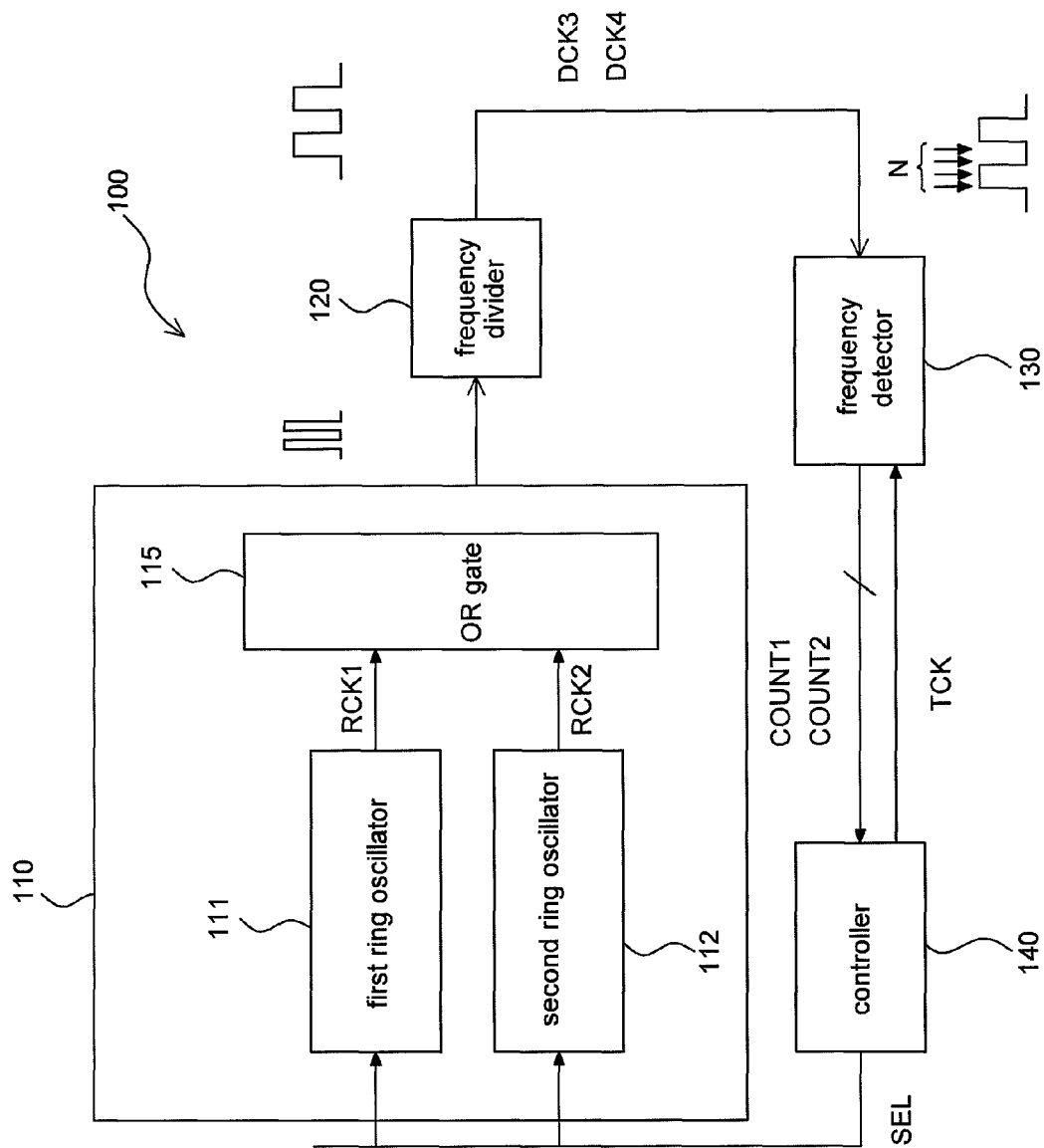
FIG. 1 shows a schematic diagram illustrating an element measurement circuit according to one embodiment of the invention.

FIG. 1 shows a schematic diagram illustrating an element measurement circuit 100 according to an embodiment of the invention. The element measurement circuit 100 may be built in a chip to measure element characteristics without using costly external measurement equipment. That is, the present invention uses an element measurement circuit built in a chip to measure the characteristics of elements inside the chip. As shown in FIG. 1, the element measurement circuit 100 includes an oscillator 110, a frequency divider 120, a frequency detector 130 and a controller 140.

The oscillator 110 generates a first oscillation clock RCK1 and a second oscillation clock RCK2 according to a selection signal SEL outputted by the controller 140. The frequency divider 120 divides the first oscillation clock RCK1 by a value M to generate a third oscillation clock DCK3 and divide the second oscillation clock RCK2 by the value M to generate a fourth oscillation clock DCK4 where the value M may be a positive integer. The frequency detector 130 detects the frequency of the third oscillation clock DCK3 according to a reference clock TCK to generate a first count value COUNT1 and detects the frequency of the fourth oscillation clock DCK4 according to the reference clock TCK to generate a second count value COUNT2. The controller 140 generates a first oscillation period according to the first count value COUNT1, generates a second oscillation period according to the second count value COUNT2, and generates a measurement value according to the first oscillation period and the second oscillation period.

Specifically, the frequency detector 130 may use the reference clock TCK to count the number of periods of the reference clock TCK from the beginning of the transition of the third oscillation clock DCK3 to the time point before the next transition of the third oscillation clock DCK3. For example, the frequency detector 130 starts to count the number of periods of the reference clock TCK from the time point of the third oscillation clock DCK3 changes state from 1 to 0 until the time point before the third oscillation clock DCK3 changes state from 1 to 0 next time to generate a number of periods N as the first count value COUNT. Accordingly, the controller 140 may calculate the approximate frequency of the first oscillation clock RCK1 and generate the period of the first oscillation clock RCK1 or delay. The calculation equations used by the controller 140 are shown as follows:

The approximate value of the frequency of the first oscillation clock RCK1

=the frequency of the third oscillation clock DCK3×M

=the frequency of the reference clock TCK÷N×M

The approximate value of the period of the first oscillation clock RCK1

=the period of the third oscillation clock DCK3÷M

=the period of the reference clock TCK×N÷M

The higher the frequency of the reference clock TCK, the higher the resolution of counting. Thus, the calculated frequency of the first oscillation clock RCK1 is more accurate. In addition, the method to generate the approximate value of the frequency of the second oscillation clock RCK2 and the approximate value of the period of the second oscillation clock RCK2 is similar and thus the details are not given hereinafter. It should be noted that the controller 140 may include a multiplier or a divider to perform the above mentioned operation on the frequency or period. Then, the controller 140 generates a measurement value according to the approximate value of the period of the first oscillation clock RCK1 and the approximate value of the period of the second oscillation clock RCK2.

Please continue to refer to FIG. 1. The oscillator 110 includes a first ring oscillator 111, a second ring oscillator 112 and a OR gate 115. The controller 140 enables one of ring oscillators selected from the first ring oscillator 111 and the second ring oscillator 112 according to a selection signal SEL, and disables the other one. Then the OR gate 115 separately outputs oscillating signals from the enabled ring oscillators as the first oscillation clock RCK1 and the second oscillation clock RCK2. In another embodiment of the invention, the oscillator 110 may include a first ring oscillator 111, a second ring oscillator 112 and a selector (for example, multiplexer) (not shown in the figure). The selector generates a selection signal SEL. The controller 140 selects one of ring oscillators from the first ring oscillator 111 and the second ring oscillator 112 according to the selection signal SEL to output oscillating signals as the first oscillation clock RCK1 and the second oscillation clock RCK2.

Figure 2:
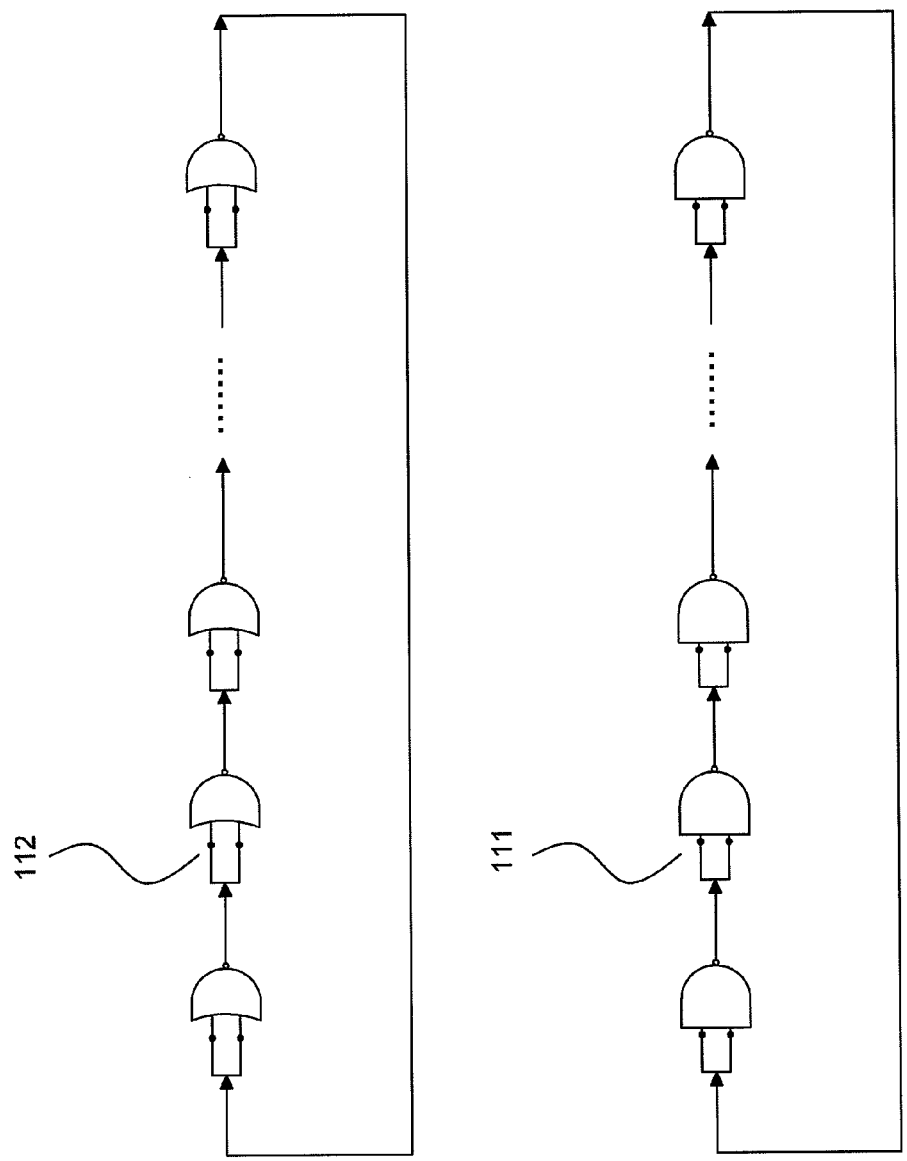
FIG. 2 shows a schematic diagram illustrating a first ring oscillator and a second ring oscillator according to one embodiment of the invention.

The ring oscillator may include an odd number of inversion cells where the inversion cell may be an inverter, NAND gate, NOR gate, etc. As shown in FIG. 2, in an embodiment, the first ring oscillator 111 includes an odd number (for example, 51 levels) of 2-input NAND gates and the second ring oscillator 112 includes an odd number (for example, 51 levels) of 2-input NOR gates. The 2-input NAND gates and the 2-input NOR gates may be selected from standard cells in a standard cell library and further selected in accordance with RVT (normal threshold voltage), HVT (high threshold voltage) or LVT (low threshold voltage) standard cells according to actual needs. Since the 2-input NAND gates includes two PMOS (p-type metal-oxide semiconductor field-effect transistor) coupled in parallel and two NMOS (n-type metal-oxide semiconductor field-effect transistor) coupled in series, and the 2-input NOR gates includes two PMOS coupled in series and two NMOS coupled in parallel, the influence of the characteristic of NMOS over the period of the first ring oscillator 111 is larger than that of the second ring oscillator 112 and the influence of the characteristic of PMOS over the period of the second ring oscillator 112 is larger than that of the first ring oscillator 111. By comparison between the periods of the two, it is determined that the current process has greater influence on which specific MOS.

Figure 3:
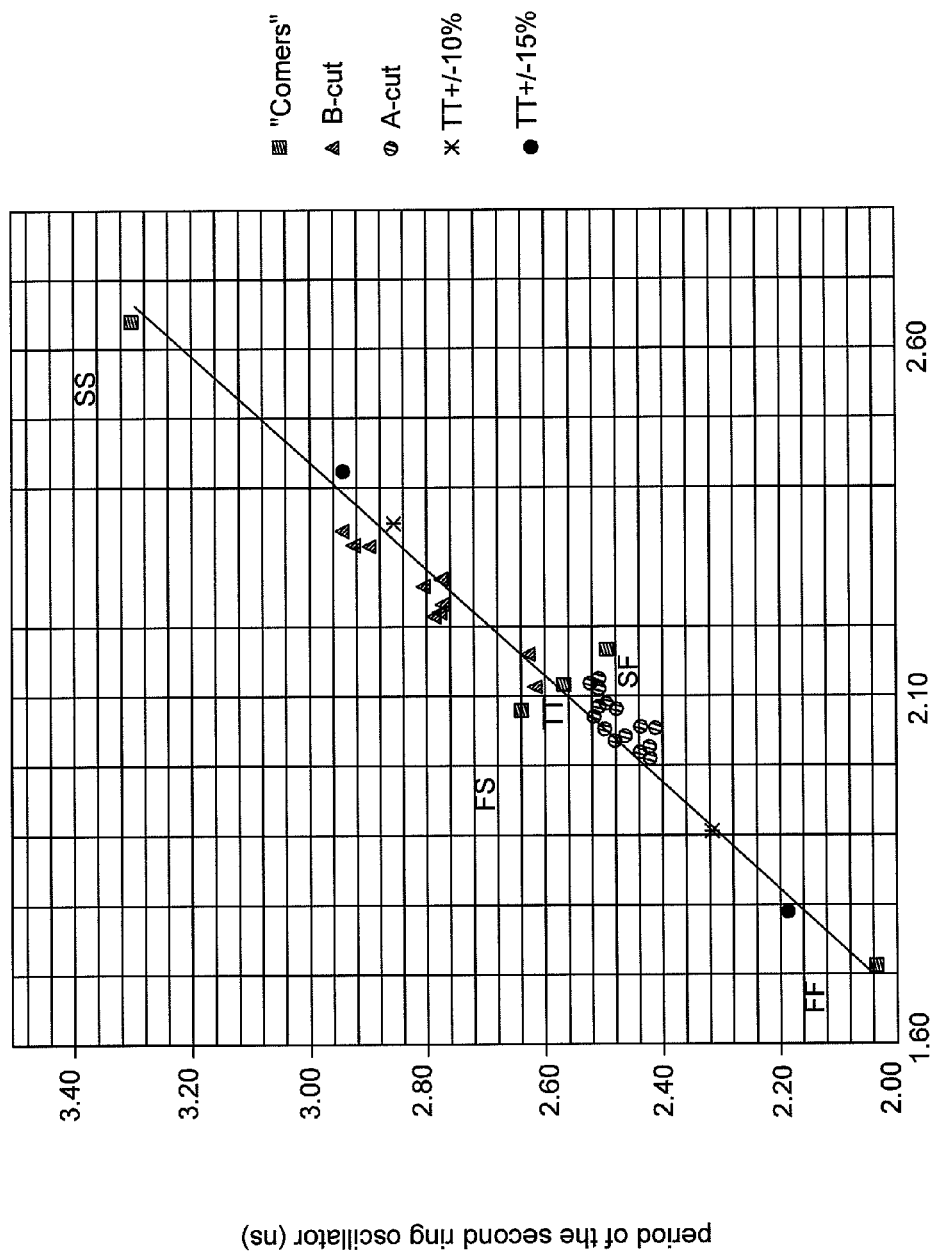
FIG. 3 shows a distribution chart.

In order to investigate conveniently, the simulation result and the measurement data are plotted into a distribution chart shown in FIG. 3. In FIG. 3, X axis stands the period of the first ring oscillator 111; Y axis stands the period of the second ring oscillator 112; and SS/FF/TT/SF/FS are five element corners of SPICE simulation. The data measured by A-cut and B-cut element measurement circuits are added into the figure and thus it can be found that the distribution of chips, wafers or cuts leans towards which process corner. For example, as shown in FIG. 3, the following information can be obtained: (1) A-cut leans towards FF corner and B-cut leans towards SS corner; (2) the points of A-cut are more gathered together than those of B-cut, meaning that die-die variation of B-cut is larger; (3) all chip speeds of A-cut are within TT±10% and some parts of B-cut are between 10%~15%.

Figure 4:
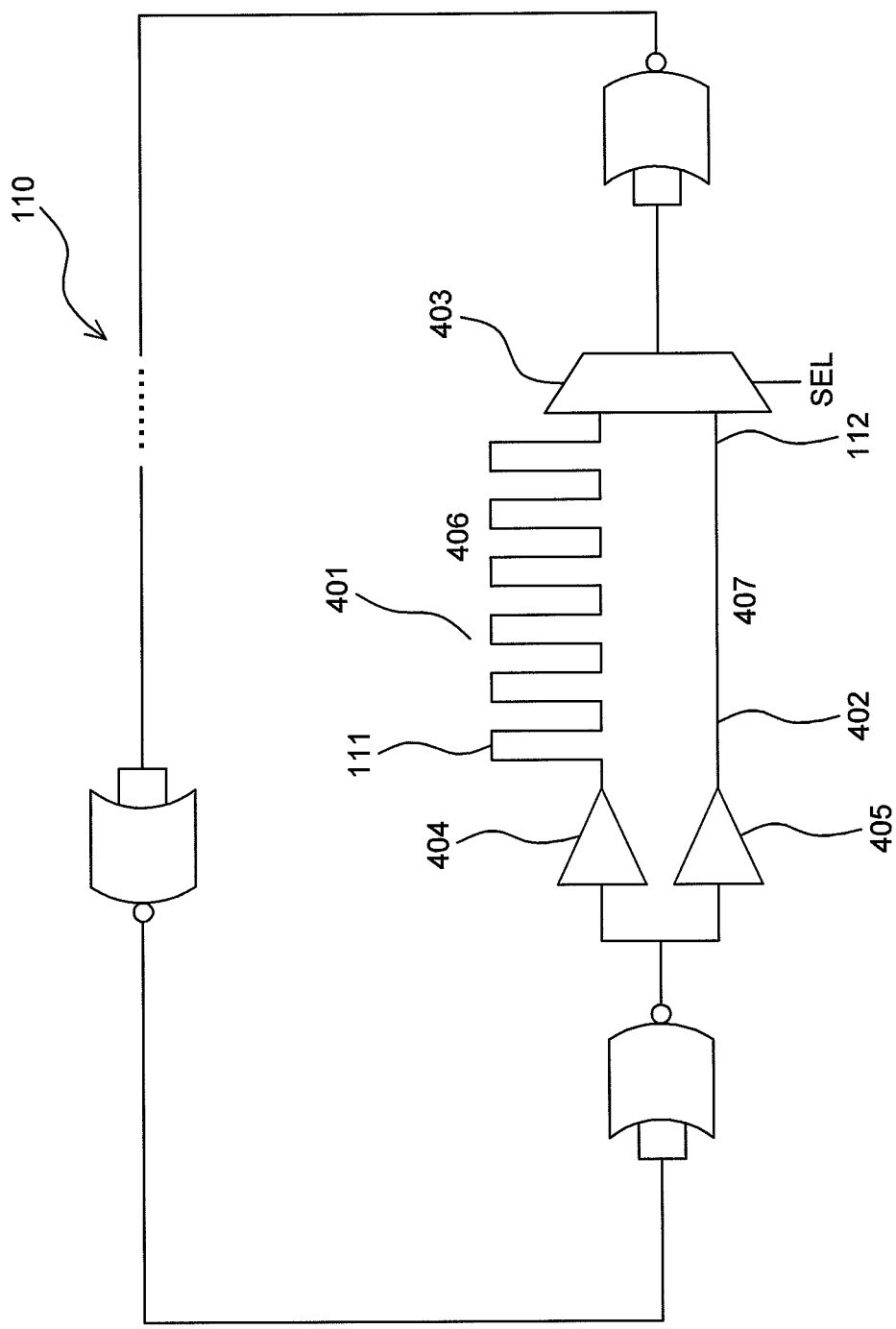
FIG. 4 shows a schematic diagram illustrating an oscillator according to one embodiment of the invention.

FIG. 4 shows a schematic diagram illustrating an oscillator 110 according to another embodiment of the invention. The difference between the oscillator 110 as shown in FIG. 4 and the oscillator 110 as shown in FIG. 2 is described as follows. Referring to FIG. 4, the first ring oscillator 111 is set between 2 inversion cells and includes a first path 401 formed by an odd number of inversion cells (for example, two-input NOR gate). The second ring oscillator 112 is set between 2 inversion cells and includes a second path 402 formed by an odd number of inversion cells. The multiplexer 403 outputs the first oscillation clock RCK1 generated from the first ring oscillator 111 or the second oscillation clock RCK2 generated by the second ring oscillator 112 according to the selection signal SEL. The first path 401 includes a first metal wire 406 and the second path 402 includes a second metal wire 407 where the first metal wire is a long conductive wire and the second metal wire is a short conductive wire. The first buffer 404 and the second buffer 405 can isolate delay effects caused by the two paths. In operation, the controller 140 generates the first oscillation period and the second oscillation period where the first oscillation period corresponds to the first oscillation clock RCK1 and the second oscillation period corresponds to the second oscillation clock RCK2. The controller 140 may include an adder and generate a measurement value by subtraction of the first oscillation period and the second oscillation period. The measurement value corresponds to a delay caused by the long conductive wire and the short conductive wire, particularly, a delay difference from the two wires.

Figure 5:
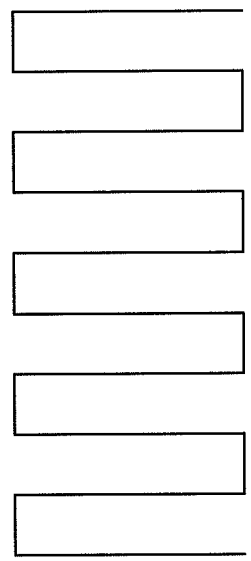
FIG. 5 shows a schematic diagram illustrating the pattern of a first metal wire according to one embodiment of the invention.

Please note that the length of the first metal wire should be long enough to tell the influence caused by the process variation. The design of the long metal wire is expected to wind a long conductive wire within a small area in order to save usage of area. In an embodiment, a conductive wire is winded along a snake-shaped winding path, such as winded method shown in FIG. 5, between multiple metal layers. Taking two layers as an example, the long conductive metal wire may be winded from metal 5 till the bottom and end point, and then coupled to metal 4 through via 4, winded again to couple back to metal 5 through via, and repeatedly winded by this pattern to obtain a long conductive wire. The winded wire can not only provide information of a single metal layer but also provide information of via between different metal layers. In another embodiment, the long metal conductive layer may be formed according to a minimum rule, such as spacing, width rule, etc., to obtain process characteristics (for example, yield) of the metal wires by the corresponding measurement value under the minimum rule. In another embodiment, the length of the first metal wire is the same as that of the second metal wire. The two metal wires are formed by multiple metal layers but the number of vias of the metal wire is different to thereby obtain the measurement values corresponding to the number of vias.

Figure 6:
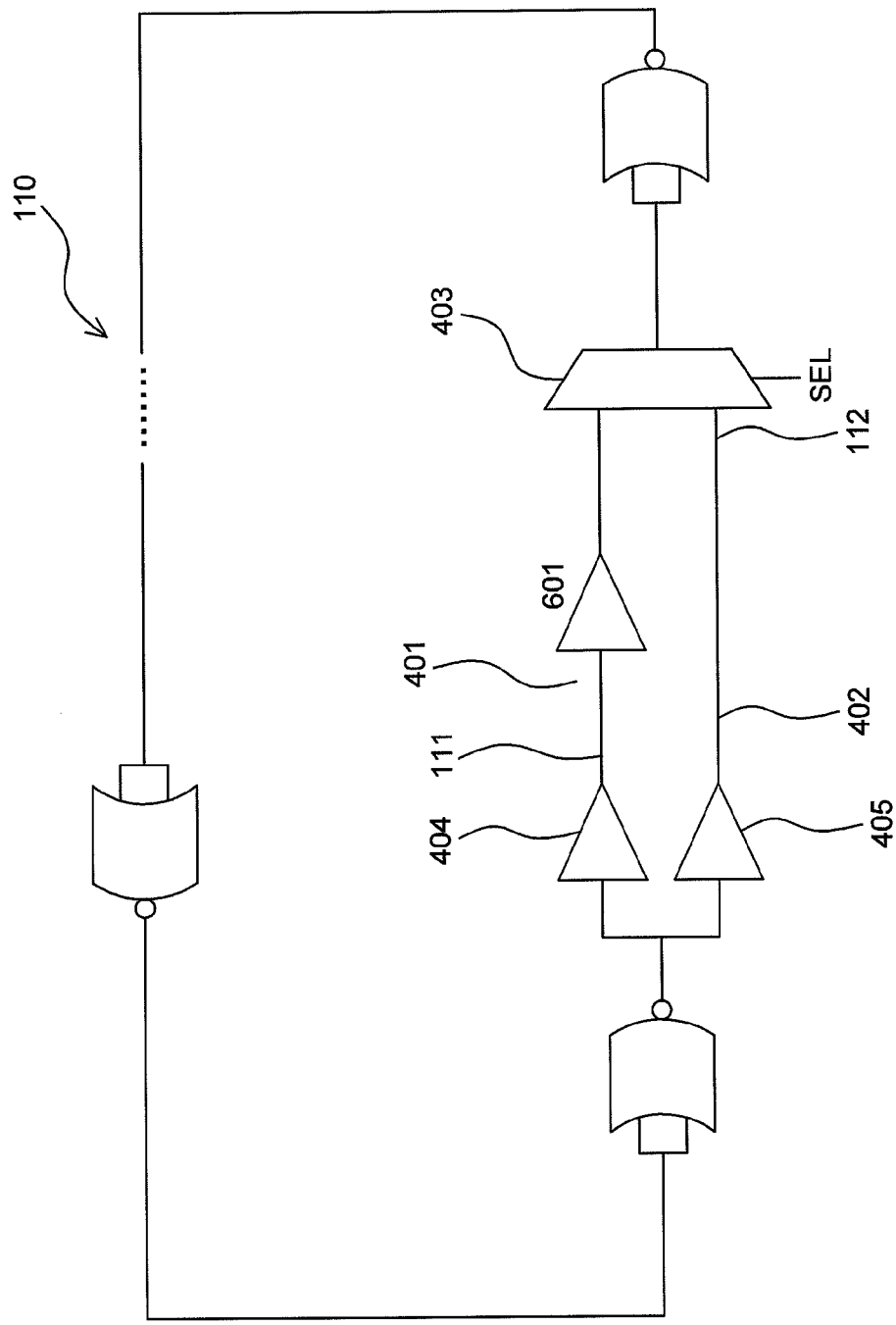
FIG. 6 shows a schematic diagram illustrating an oscillator according to one embodiment of the invention.

FIG. 6 shows a schematic diagram illustrating an oscillator 110 according to an embodiment of the invention. The difference between the oscillator 110 of FIG. 6 and the oscillator 110 of FIG. 4 is described as follows. As shown in FIG. 6, the first ring oscillator 111 includes a first path 401 and the second ring oscillator 112 includes a second path 402. The first ring oscillator 111 and the second ring oscillator 112 generate a first oscillation clock RCK1 and a second oscillation clock RCK2 respectively. The multiplexer 403 separately outputs the first oscillation clock RCK1 and the second oscillation clock RCK2 according to a selection signal SEL. The first path 401 includes a delay cell 601 but the second path 402 does not. The delay cell may be, for example, a buffer. In operation, the controller 140 generates a first oscillation period and a second oscillation period where the first oscillation period corresponds to the first oscillation clock RCK1 and the second oscillation period corresponds to the second oscillation clock RCK2. The controller 140 generates a measurement value by subtraction of the first oscillation period and the second oscillation period. Further the measurement value corresponds to a delay caused by the delay cell.

Figure 7:
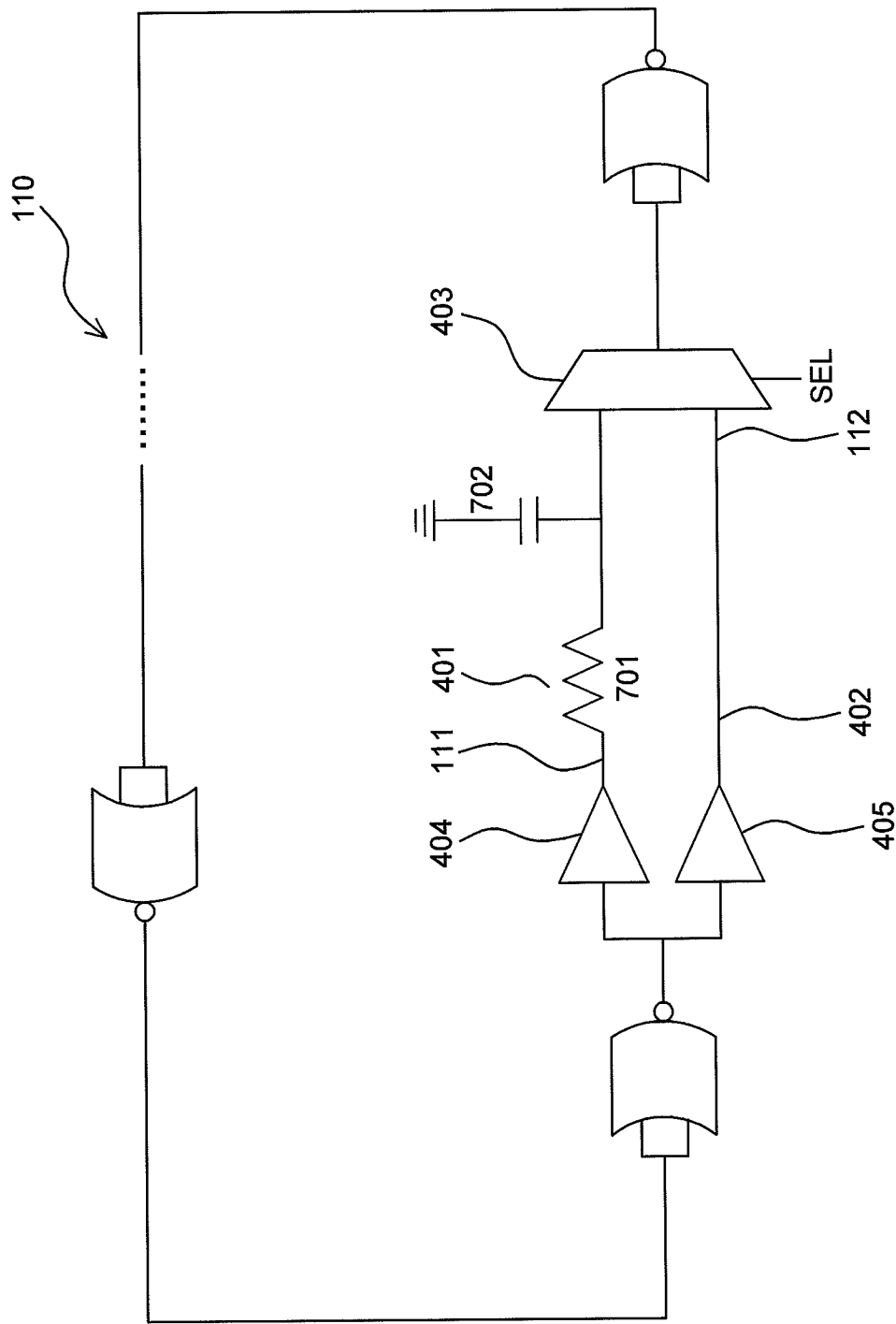
FIG. 7 shows a schematic diagram illustrating an oscillator according to one embodiment of the invention.

FIG. 7 shows a schematic diagram illustrating an oscillator 110 according to an embodiment of the invention. The difference between the oscillator 110 of FIG. 7 and the oscillator 110 of FIG. 6 is described as follows. As shown in FIG. 7, the first ring oscillator 111 includes a first path 401 and the second ring oscillator 112 includes a second path 402. The first ring oscillator 111 and the second ring oscillator 112 generate a first oscillation clock RCK1 and a second oscillation clock RCK2 respectively. The multiplexer 403 separately outputs the first oscillation clock RCK1 and the second oscillation clock RCK2 according to the selection signal SEL. The first path 401 includes a serial resistance 701 or coupled capacitor 702 but the second path 402 includes neither resistor nor capacitor. One end of the capacitor 702 couples to the first path 401 and the other end couples to couples to ground. In operation, the controller 140 generates a first oscillation period and a second oscillation period where the first oscillation period corresponds to the first oscillation clock RCK1 and the second oscillation period corresponds to the second oscillation clock RCK2. The controller 140 generates a measurement value by subtraction of the first oscillation period and the second oscillation period. Further the measurement value corresponds to a delay caused by the resistor or the capacitor.

An embodiment of the invention further discloses an element measurement method, comprising the following steps:
using an oscillator to generate a first oscillation clock and a second oscillation clock;
dividing the first oscillation clock to generate a third oscillation clock;
dividing the second oscillation clock to generate a fourth oscillation clock;
detecting the frequency of the third oscillation clock according to a reference clock to generate a first oscillation period corresponding to the first oscillation clock;
detecting the frequency of the fourth oscillation clock according to the reference clock to generate a second oscillation period corresponding to the second oscillation clock; and
generating a measurement value according to the first oscillation period and the second oscillation period.

In an embodiment, the element measurement method may further includes the following step:
performing a subtraction operation between the first oscillation period and the second oscillation period to generate the measurement value.

In conclusion, the element measurement circuit of embodiments of the invention may be built in a chip without any external measurement equipment or test machine which is required to measure elements characteristics of the chip. Therefore, the complexity of dividers can be greatly reduced.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. An element measurement circuit, comprising:
    an oscillator, for generating a first oscillation clock and a second oscillation clock;
    a frequency divider, for dividing the first oscillation clock to generate a third oscillation clock, and for dividing the second oscillation clock to generate a fourth oscillation clock;
    a frequency detector, for detecting a frequency of the third oscillation clock according to a reference clock to generate a first count value, and for detecting a frequency of the fourth oscillation clock according to the reference clock to generate a second count value; and
    a controller, for generating a first oscillation period according to the first count value, for generating a second oscillation period according to the second count value, and for generating a measurement value according to the first oscillation period and the second oscillation period;
    wherein the frequency divider divides the first oscillation clock by M and divides the second oscillation clock by M; the controller generates the first oscillation period by multiplying the period of the reference clock by the first count value and dividing by M; the controller generates the second oscillation period by multiplying the period of the reference clock by the second count value and dividing by M; the first oscillation period corresponds to the frequency of the first oscillation clock; and the second oscillation period corresponds to the frequency of the second oscillation clock.

2. The circuit according to claim 1, wherein the oscillator comprises:
    a first ring oscillator, comprising a plurality of NAND gates coupled in series wherein the first ring oscillator is used for generating the first oscillation clock and; and
    a second ring oscillator, comprising a plurality of NOR gates coupled in series wherein the second ring oscillator is used for generating the second oscillation clock and;
    wherein the NAND gates and the NOR gates are selected from a standard cell library.

3. The circuit according to claim 1, wherein the oscillator comprises:
    a first ring oscillator, for generating the first oscillation clock, and comprising a plurality of inversion cells coupled in series and a first metal wire coupled to the inversion cells in series; and
    a second ring oscillator, for generating the second oscillation clock and comprising a plurality of inversion cells coupled in series and a second metal wire coupled to the inversion cells in series;
    wherein a length the first metal wire is longer than that of the second metal wire.

4. The circuit according to claim 3, wherein the controller generates the measurement value by a subtraction operation between the first oscillation period and the second oscillation period, and the measurement value corresponds to a delay caused by the first metal wire and the second metal wire.

5. The circuit according to claim 1, wherein the oscillator comprises:
    a first ring oscillator, for generating the first oscillation clock, and comprising a plurality of inversion cells coupled in series and a delay cell coupled to the inversion cells in series; and
    a second ring oscillator, for generating the second oscillation clock, and comprising a plurality of inversion cells coupled in series;
    wherein the inversion cells and the delay cell are selected from a standard cell library.

6. The circuit according to claim 5, wherein the controller generates the measurement value by a subtraction operation between the first oscillation period and the second oscillation period, and the measurement value corresponds to a delay caused by the delay cell.

7. The circuit according to claim 1, wherein the oscillator comprises:
   a first ring oscillator, for generating the first oscillation clock, and comprising a plurality of inversion cells coupled in series and a resistor coupled to the inversion cells in series; and
   a second ring oscillator, for generating the second oscillation clock, and comprising a plurality of inversion cells coupled in series.

8. The circuit according to claim 7, wherein the controller generates the measurement value by a subtraction operation between the first oscillation period and the second oscillation period, and the measurement value corresponds to a delay caused by the resistor.

9. The circuit according to claim 1, wherein the oscillator comprises:
   a first ring oscillator, for generating the first oscillation clock, and comprising a plurality of inversion cells coupled in series and a capacitor coupled to the inversion cells; and
   a second ring oscillator, for generating the second oscillation clock, and comprising a plurality of inversion cells coupled in series;
   wherein one end of the capacitor is coupled to ground.

10. The circuit according to claim 9, wherein the controller generates the measurement value by a subtraction operation between the first oscillation period and the second oscillation period, and the measurement value corresponds to a delay caused by the capacitor.

11. An element measurement method, comprising:
   using an oscillator to generate a first oscillation clock and a second oscillation clock;
   dividing the first oscillation clock to generate a third oscillation clock;
   dividing the second oscillation clock to generate a fourth oscillation clock;
   detecting a frequency of the third oscillation clock according to a reference clock to generate a first oscillation period corresponding to the first oscillation clock;
   detecting a frequency of the fourth oscillation clock according to the reference clock to generate a second oscillation period corresponding to the second oscillation clock; and
   generating a measurement value according to the first oscillation period and the second oscillation period;
   performing a subtraction operation between the first oscillation period and the second oscillation period to generate the measurement value;
   wherein the measurement value corresponds to a delay caused by a first metal wire and a second metal wire.

12. The method according to claim 11, wherein the oscillator comprises:
   a first ring oscillator, comprising a plurality of NAND gates coupled in series, wherein the first ring oscillator is used for generating the first oscillation clock; and
   a second ring oscillator, comprising a plurality of NOR gates coupled in series, wherein the second ring oscillator is used for generating the second oscillation clock;
   wherein the NAND gates and the NOR gates are selected from a standard cell library.

13. The method according to claim 11, wherein the oscillator comprises:
   a first ring oscillator, for generating the first oscillation clock, and comprising a plurality of inversion cells coupled in series and the first metal wire coupled to the inversion cells in series; and
   a second ring oscillator, for generating the second oscillation clock, and comprising a plurality of inversion cells coupled in series and the second metal wire coupled to the inversion cells in series;
   wherein a length of the first metal wire is longer than the second metal wire.

14. An element measurement circuit, comprising:
   an oscillator, for generating a first oscillation clock and a second oscillation clock;
   a frequency divider, for dividing the first oscillation clock to generate a third oscillation clock, and for dividing the second oscillation clock to generate a fourth oscillation clock;
   a frequency detector, for detecting a frequency of the third oscillation clock according to a reference clock to generate a first count value, and for detecting a frequency of the fourth oscillation clock according to the reference clock to generate a second count value; and
   a controller, for generating a first oscillation period according to the first count value, for generating a second oscillation period according to the second count value, and for generating a measurement value according to the first oscillation period and the second oscillation period;
   wherein the oscillator comprises:
   a first ring oscillator, for generating the first oscillation clock, and comprising a plurality of inversion cells coupled in series and a delay cell coupled to the inversion cells in series; and
   a second ring oscillator, for generating the second oscillation clock, and comprising a plurality of inversion cells coupled in series;
   wherein the controller generates the measurement value by a subtraction operation between the first oscillation period and the second oscillation period, and the measurement value corresponds to a delay caused by the delay cell.

15. The circuit according to claim 14, wherein the delay cell is a buffer, a resistor, a capacitor, or a conductive wire which is winded along a snake-shaped winding path.

* * * * *